(12) United States Patent
Ziglioli et al.

(10) Patent No.: US 7,998,774 B2
(45) Date of Patent: Aug. 16, 2011

(54) PACKAGE, IN PARTICULAR FOR MEMS DEVICES AND METHOD OF MAKING SAME

(75) Inventors: Federico Giovanni Ziglioli, Gessate (IT); Fulvio Vittorio Fontana, Monza (IT); Mark Shaw, Milan (IT)

(73) Assignee: STMicroelectronics S.r.l., Agrate Brianza (IT)

( * ) Notice: Subject to any disclaimer, the term of this patent is extended or adjusted under 35 U.S.C. 154(b) by 0 days.

(21) Appl. No.: 12/982,458

(22) Filed: Dec. 30, 2010

(65) Prior Publication Data

US 2011/0092009 A1 Apr. 21, 2011

Related U.S. Application Data

(62) Division of application No. 12/006,709, filed on Jan. 4, 2008, now Pat. No. 7,898,043.

(30) Foreign Application Priority Data

Jan. 4, 2007 (IT) ............................... MI2007A0007
Jan. 4, 2007 (IT) ............................... MI2007A0008

(51) Int. Cl.
*H01L 27/14* (2006.01)

(52) U.S. Cl. .......... 438/51; 438/125; 257/415; 257/698; 257/E23.19; 257/E29.324

(58) Field of Classification Search ................... 438/415, 438/698, E23.19, E21.5, E29.324; 257/51, 257/125

See application file for complete search history.

(56) References Cited

U.S. PATENT DOCUMENTS

| 6,624,003 | B1 | 9/2003 | Rice |
| 2001/0007733 | A1 | 7/2001 | Matsuyama et al. |
| 2002/0054422 | A1 | 5/2002 | Carr et al. |
| 2003/0059976 | A1 | 3/2003 | Nathan et al. |
| 2005/0120553 | A1 | 6/2005 | Brown et al. |
| 2005/0263841 | A1 | 12/2005 | Fincato |
| 2006/0086899 | A1 | 4/2006 | Chao et al. |
| 2006/0128058 | A1 | 6/2006 | Dungan et al. |
| 2006/0148137 | A1* | 7/2006 | Hartzell et al. ............... 438/149 |
| 2008/0164543 | A1 | 7/2008 | Ziglioli et al. |
| 2008/0179697 | A1 | 7/2008 | Cortese et al. |

FOREIGN PATENT DOCUMENTS

EP 1775259 10/2005
EP 1945561 7/2008

* cited by examiner

*Primary Examiner* — Jami M Valentine
(74) *Attorney, Agent, or Firm* — Lisa K. Jorgenson; Kevin D. Jablonski; Graybeal Jackson LLP

(57) ABSTRACT

A package includes a substrate provided with a passing opening and a MEMS device. The MEMS device includes an active surface wherein a portion of the MEMS device is integrated sensitive to the chemical/physical variations of a fluid. The active surface of the MEMS device faces the substrate and is spaced therefrom, the sensitive portion being aligned to the passing opening. A protective package incorporates the MEMS device and the substrate, leaving at least the sensitive portion of the MEMS device exposed through the passing opening of the substrate.

14 Claims, 6 Drawing Sheets

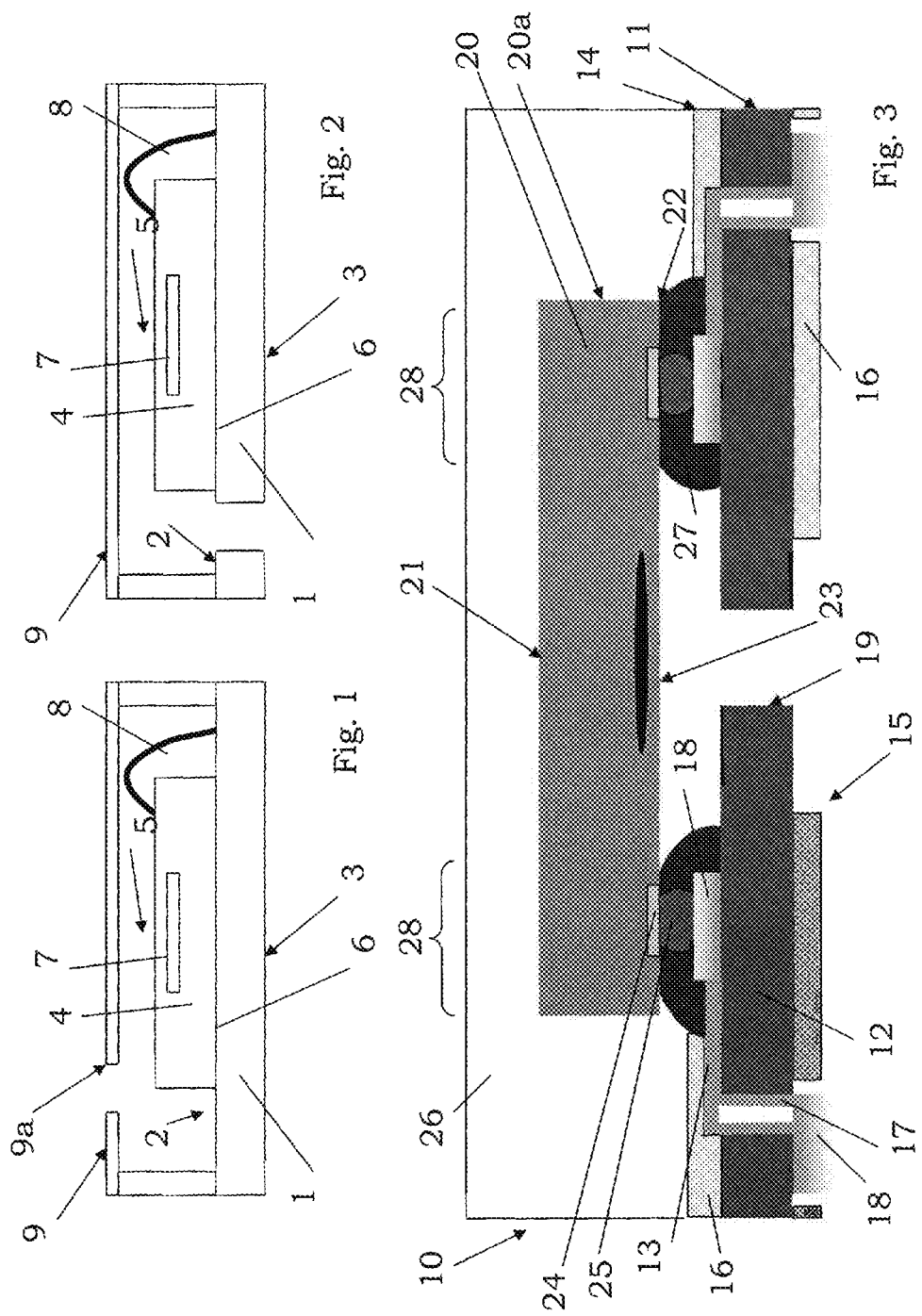

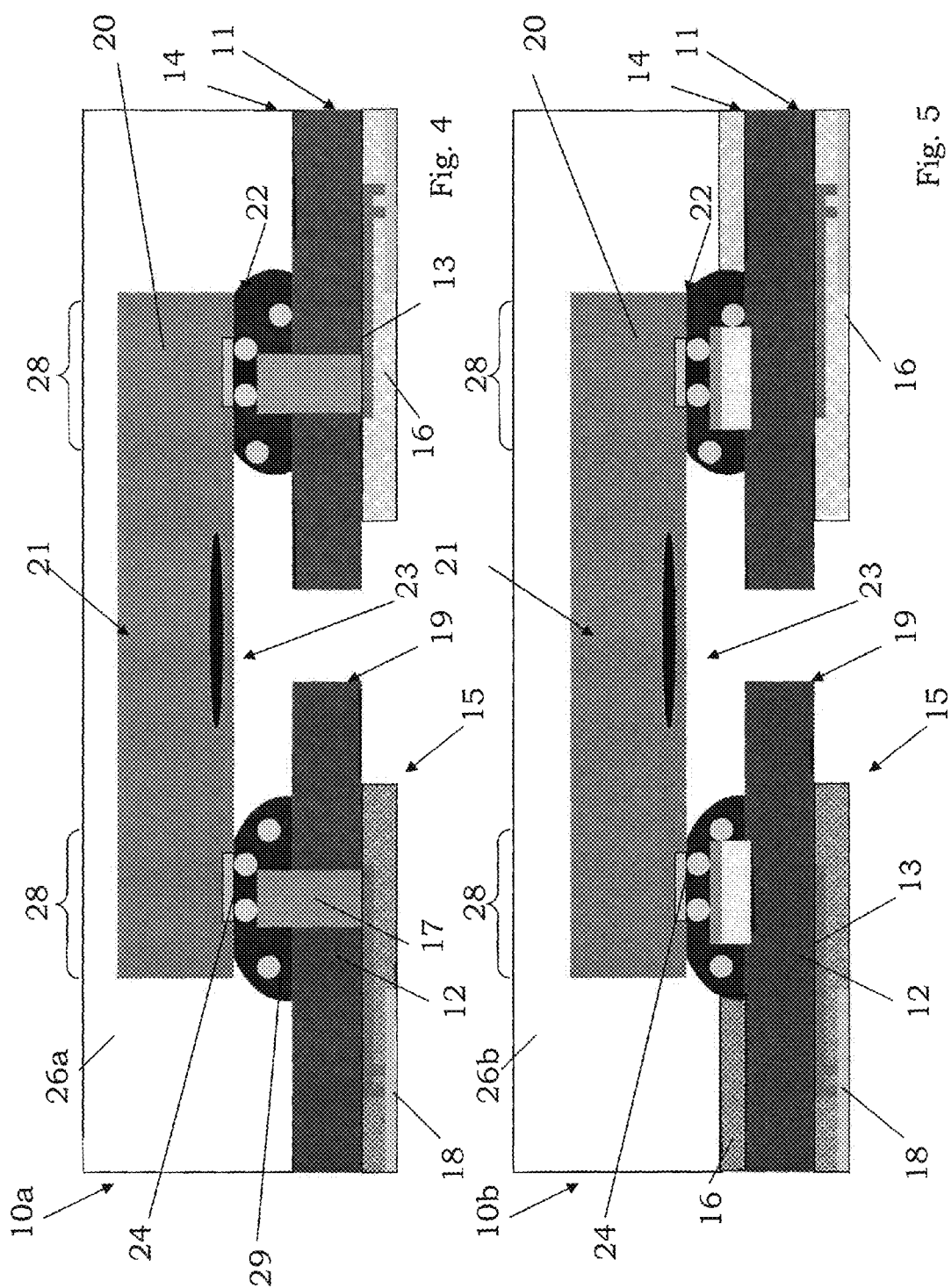

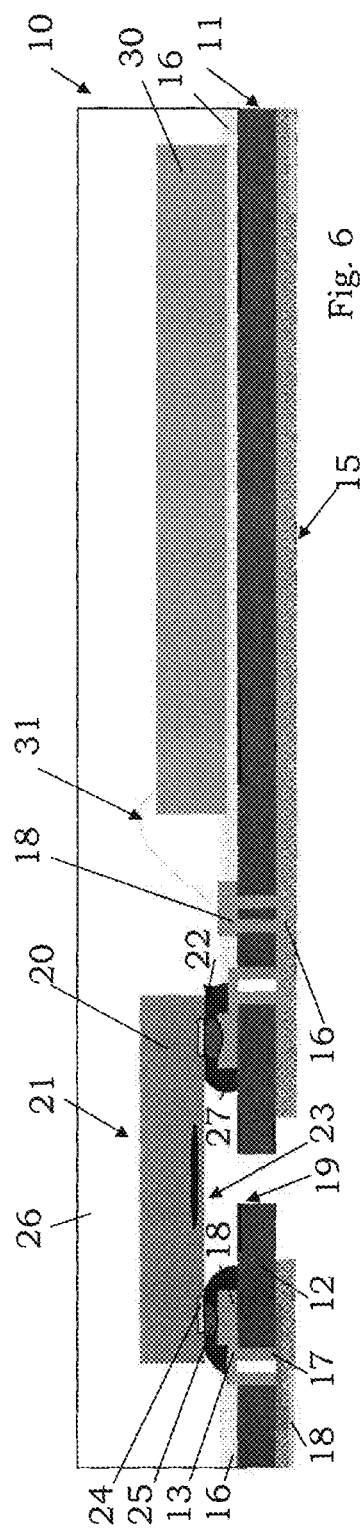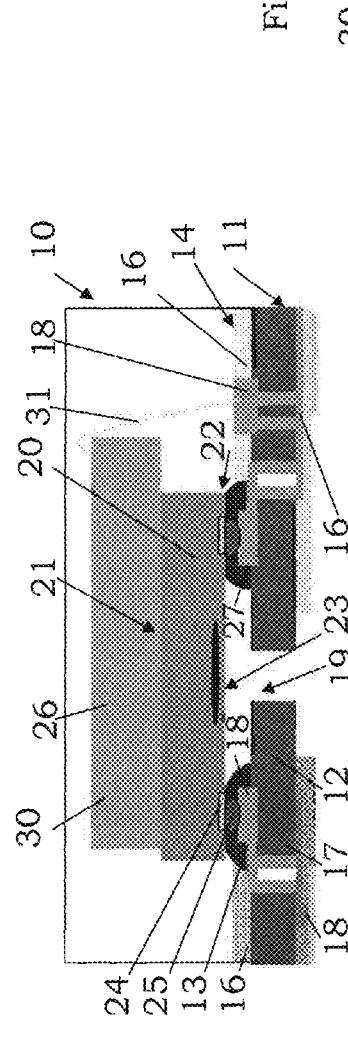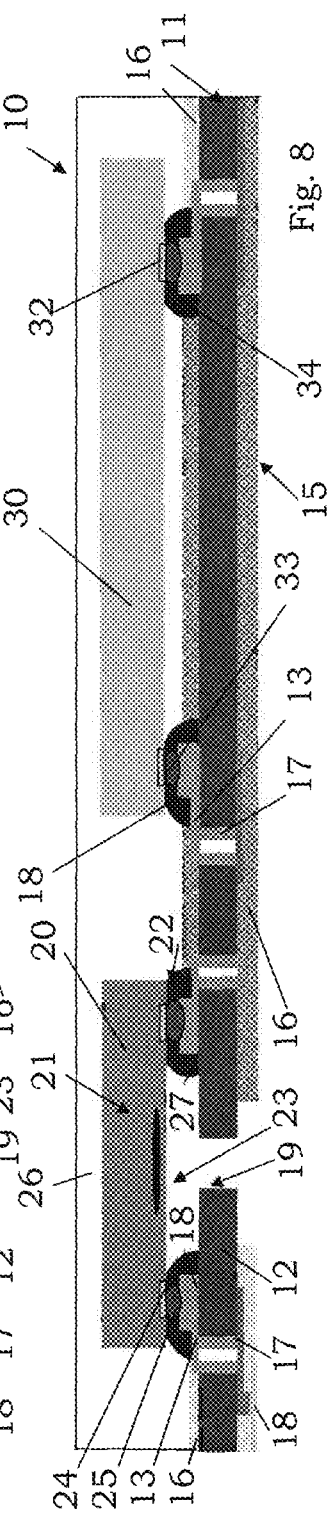

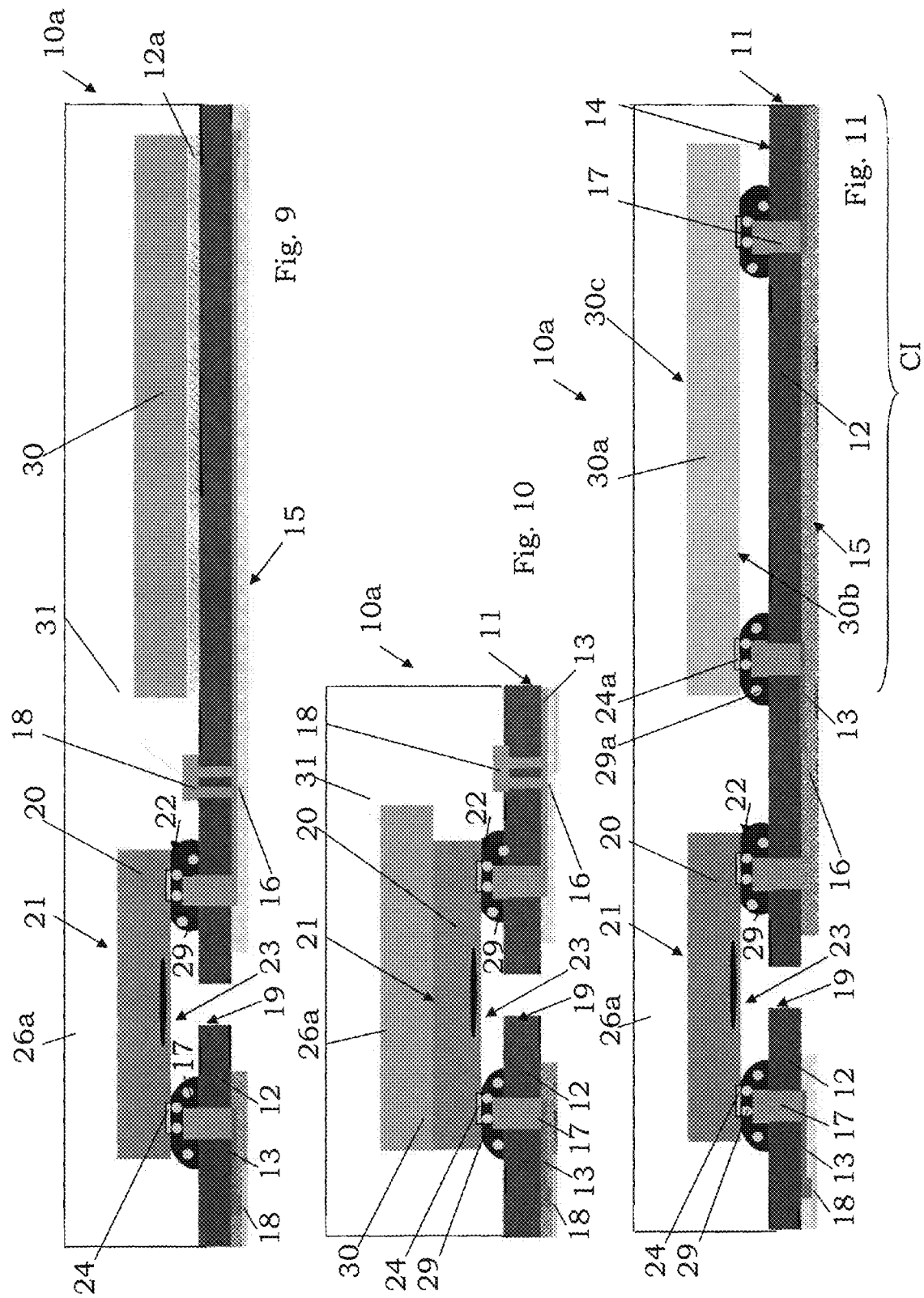

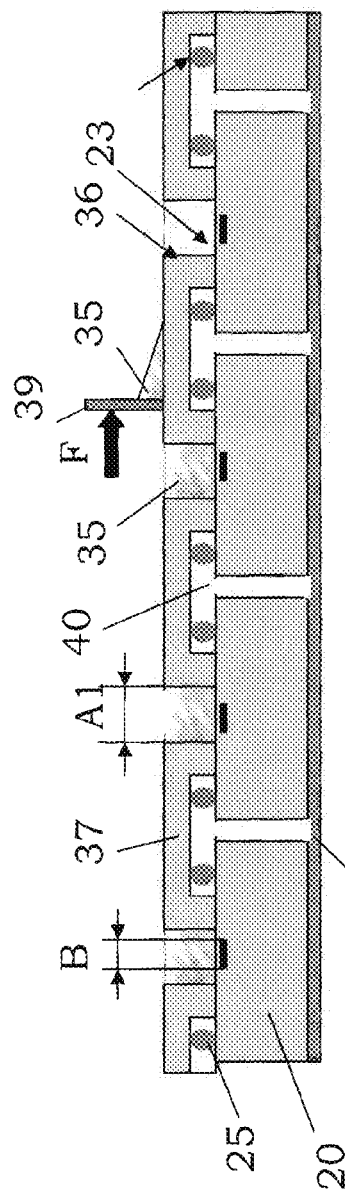
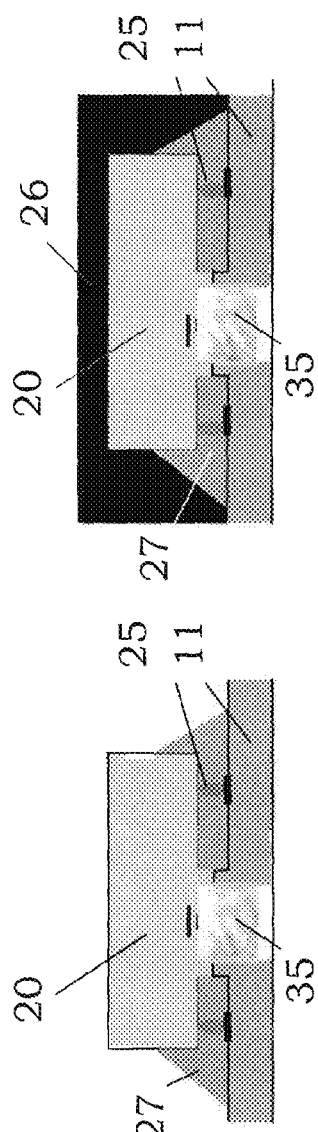
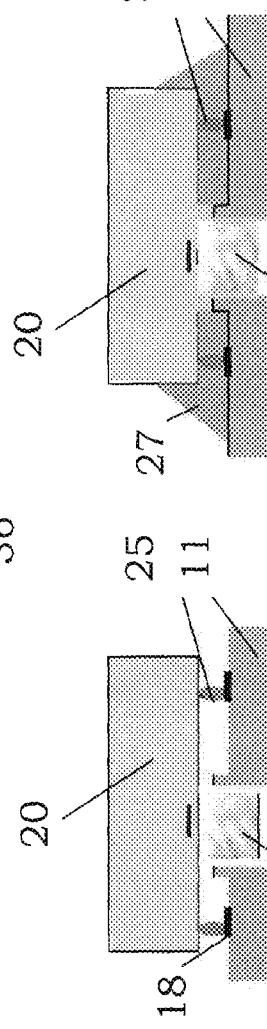
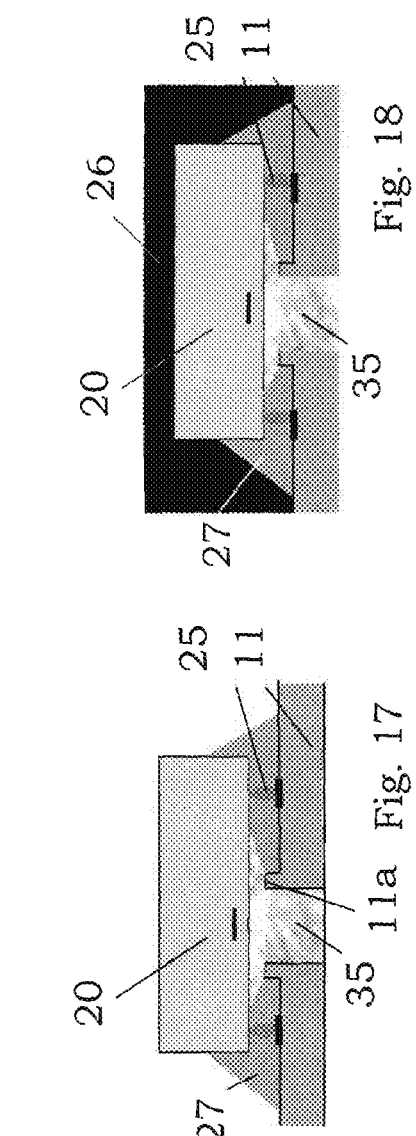
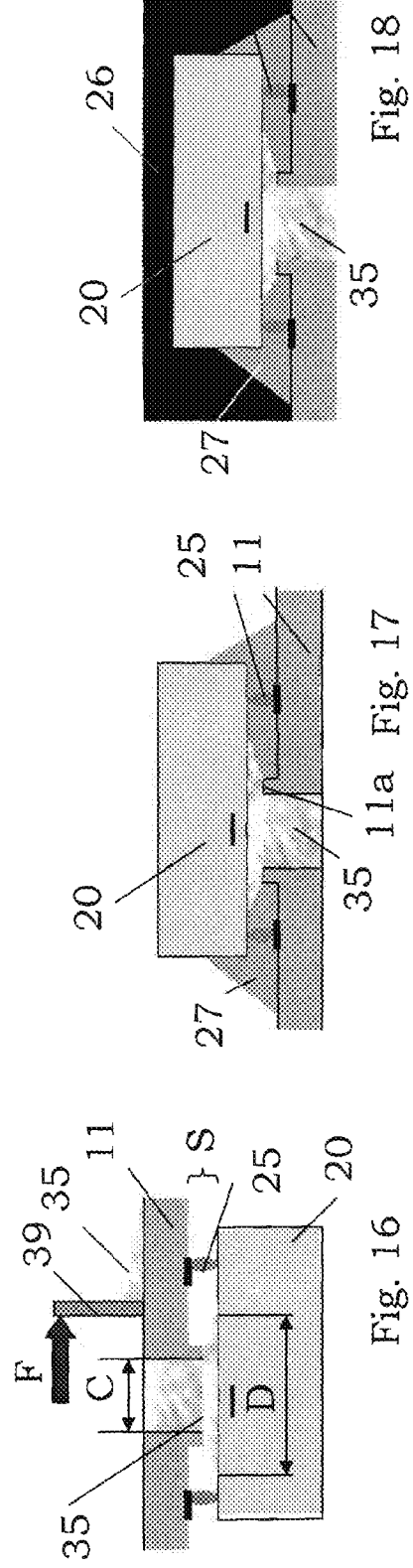

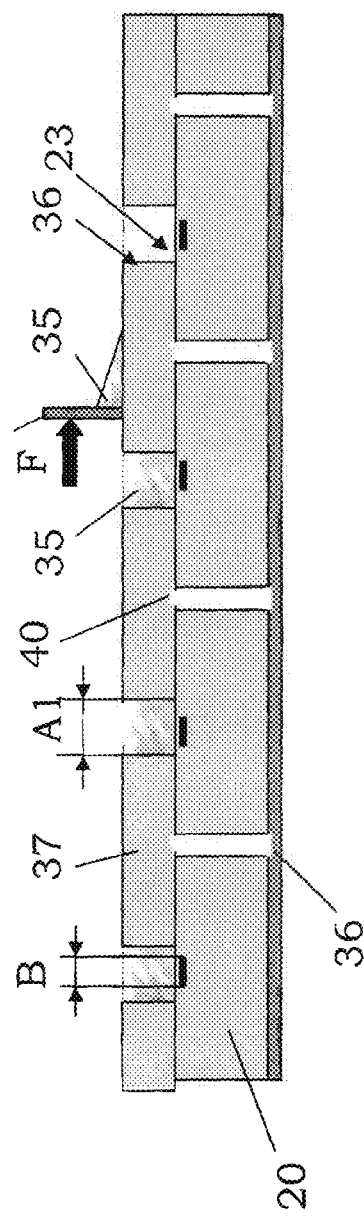
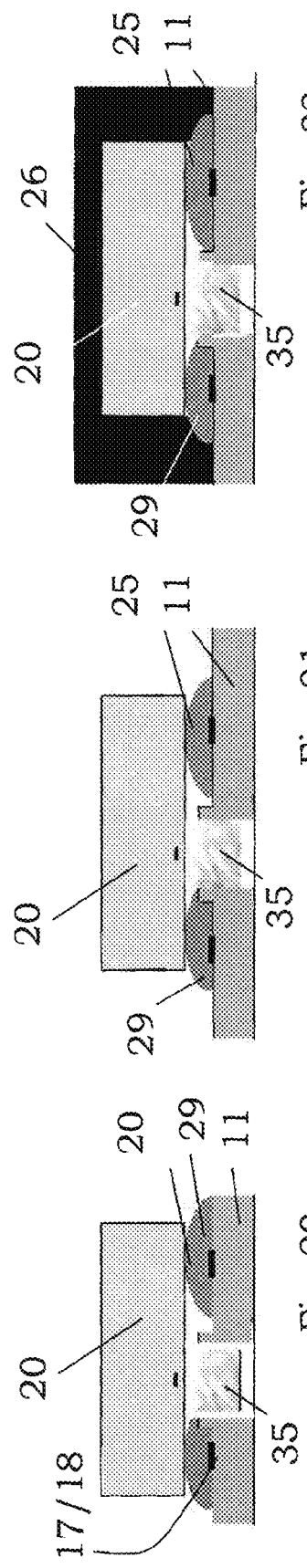

PACKAGE, IN PARTICULAR FOR MEMS DEVICES AND METHOD OF MAKING SAME

PRIORITY CLAIM

The present application is a divisional of U.S. patent application Ser. No. 12/006,709, filed Jan. 4, 2008, which application claims priority from Italian patent application No. MI2007A 000007, filed Jan. 4, 2007, and Italian patent application No. MI2007A 000008, filed Jan. 4, 2007, all of these applications are incorporated herein by reference in their entireties.

TECHNICAL FIELD

Embodiments of the present invention generally relate to packages, in particular for MEMS devices.

Embodiments of the invention particularly, but not exclusively, relate to a package for MEMS devices mounted on a substrate, for example of the LGA/BGA type. The following description is made with reference to this field of application for convenience of illustration only.

BACKGROUND

As it is well known, a device with a micro-electro-mechanical system (MEMS) is a micro device, which integrates the mechanical and electrical functions in a silicon chip or die realized by using the lithographic techniques of micro-manufacturing. The final assembled device is typically made of the MEMS silicon die and optionally of integrated circuits for specific applications (application specific integrated circuits or ASICs) mounted on a substrate, for example of the LGA or BGA type (Land Grid Array or Ball Grid Array), flanked or piled onto the MEMS device, using conventional assembling processes.

In fact, it is well known that integrated circuits (IC) are manufactured on the surface of a semiconductor wafer and subsequently singulated in different semiconductor devices, or "dies". Since the material of a semiconductor wafer—commonly silicon—tends to be relatively fragile, the dies are usually mounted on protective housings, or packages prior to the connection to a printed circuit board (PCB), the package ensuring the interconnection between the dies and the board.

It is also known that the substrate of the LGA/BGA type is covered by tracks of layers of conductive materials (usually copper), insulated from each other by layers of insulating or dielectric material. Conductive holes, called "vias", are typically realized through the insulating layers with a vertical orientation with respect to the conductive layers, to form conductive paths between conductive tracks present on different insulating layers.

A first embodiment of this type of device with micro-electro-mechanical system (MEMS) realized on a substrate LGA/BGA and subsequently encapsulated in a package is shown with reference to FIG. 1.

On a substrate 1, of the LGA/BGA type, having an upper surface 2 and a lower surface 3, a MEMS device 4 is glued comprising a silicon die having an active surface 5 and a non active surface 6 opposed to the active surface 5. In particular, in the silicon die, in correspondence with the active surface 5, a membrane 7 is integrated to realize a pressure sensor.

The non active surface 5 of the silicon die is glued onto the upper surface 2 of the substrate 1.

The active surface 5 is then electrically connected to the substrate 1 by means of a conductive wire 8, for example through the conventional wire-bonding technique.

A cap 9 provided with an opening 9a is then overlapped onto the MEMS device 4 and onto the electric connections 8 and fixed onto the upper surface 2 of the substrate 1 so as to protect the MEMS device 4.

The presence of the opening 9a allows the MEMS device 4 to communicate with the environment outside the cap 9, for sensing variations of fluids such as, for example, air or water.

A second embodiment of this type of micro-electro-mechanical system device (MEMS) realized on a substrate LGA/BGA and subsequently encapsulated in a package is shown with reference to FIG. 2.

Elements being structurally and functionally identical with respect to the package described with reference to FIG. 1 will be given the same reference numbers.

In this embodiment the MEMS device 4 communicates with the outer environment by means of an opening 1a realized in a portion of the substrate 1 physically connected to the MEMS device, while the cap 9 is completely closed.

Although advantageous under several aspects, this solution shows a drawback in that the cap 9 must be suitably manufactured and fixed onto the upper surface 2 of the substrate 1.

Improved packages, in particular for MEMS devices, are needed having structural and functional characteristics so as to allow avoiding the construction of caps and overcoming the drawbacks still limiting the packages realized according to the prior art.

SUMMARY

Embodiments of the present invention are directed to a package, in particular for MEMS devices, completely realized through molding.

In one embodiment, a package includes a substrate provided with a passing opening and a MEMS device comprising an active surface wherein a portion of the MEMS device is integrated sensitive to chemical/physical variations of a fluid. The active surface of the MEMS device faces the substrate and is spaced therefrom, the sensitive portion being aligned to the opening, and it also includes a protective package, which incorporates the MEMS device and the substrate, leaving at least the sensitive portion of the MEMS device exposed through the passing opening of the substrate.

In another embodiment, a package which includes a substrate comprising an insulating core and an integrated circuit comprising an active surface. The active surface of the integrated circuit faces the substrate and is spaced therefrom, and it also includes a protective package, which incorporates the integrated circuit and the substrate. Conductive vias project with respect to the insulating core in correspondence with an upper surface of the substrate facing the active surface of the integrated circuit. The upper surface is free from masking layers, the electric connection between the integrated circuit and the conductive vias being obtained through interposition of a layer of connection material.

A method according to another embodiment protects packages which comprise a substrate provided with a passing opening, and at least a MEMS device comprising an active surface wherein a portion of the MEMS device, sensitive to chemical/physical variations of a fluid, is integrated. The method includes the following steps: forming, on the sensitive portion, a protection layer which fills at least partially the passing opening, forming a protective package, which incorporates the MEMS device and the substrate, leaving the protection layer exposed, and removing the protection layer so that the protective package leaves at least the sensitive portion of the MEMS device exposed through the opening of the substrate.

The characteristics and the advantages of packages and methods of forming such packages according to the invention will be apparent from the following description of embodiments thereof given by way of indicative and non-limiting example with reference to the annexed drawings.

BRIEF DESCRIPTION OF THE DRAWINGS

In these drawings:

FIG. 1 is a sectional view of a conventional package for MEMS devices,

FIG. 2 is a sectional view of another conventional package for MEMS devices,

FIG. 3 is a sectional view of a package for MEMS devices according to a first embodiment of the invention, FIG. 4 is a sectional view of a package for MEMS devices according to a second embodiment of the invention, FIG. 5 is a sectional view of a package for MEMS devices according to a third embodiment of the invention, FIGS. 6 to 8 show possible applications of the package for MEMS devices of FIG. 3, FIGS. 9 to 11 show possible applications of the package for MEMS devices of FIG. 4, FIGS. 12 to 15 are sectional views of packages for MEMS devices realized according to embodiments of the invention, during some manufacturing steps of a protection method according to a first embodiment of the invention, FIGS. 16 to 18 are sectional views of packages for MEMS devices realized according to embodiments of the invention, during some manufacturing steps of a protection method according to a second embodiment of the invention, FIGS. 19 to 22 are sectional views of packages for MEMS devices realized according to embodiments of the invention, during some manufacturing steps of a further version of a protection method according to the first embodiment of the invention.

DETAILED DESCRIPTION

The following discussion is presented to enable a person skilled in the art to make and use the invention. Various modifications to the embodiments will be readily apparent to those skilled in the art, and the generic principles herein may be applied to other embodiments and applications without departing from the spirit and scope of the present invention. Thus, the present invention is not intended to be limited to the embodiments shown, but is to be accorded the widest scope consistent with the principles and features disclosed herein.

With reference to FIG. 3, a package 10 for MEMS devices according to a first embodiment of the invention includes a substrate 11, for example of the LGA/BGA type.

A conventional substrate of the LGA/BGA type, like the one shown in FIG. 3, comprises an insulating core 12 of a polymeric material (for example, triazine and bismaleimide resin (BT)) and is coated by metallic layers 13, for example of copper. Conductive tracks are shaped in the metallic layers 13, and are indicated, hereafter, with the same reference number as the metallic layers 13.

The number of insulating layers alternated with conductive layers which can be used in a conventional substrate of the LGA/BGA type can vary from 2 to 4.

The conductive tracks 13 present on an upper surface 14 and a lower surface 15 of the substrate 11 are coated by a masking layer 16 for avoiding the oxidation of the conductive tracks 13 themselves.

For a substrate 11 with two LGA/BGA layers, shown in FIG. 3, the standard values of total thickness are comprised between 200-300 µm, the thickness of the insulating core 12 is comprised between 100 µm and 200 µm, the thickness of each metallic layer 13 is comprised between 12-28 µm, while the thickness of the layer 16 of the masking is of about 25 µm.

Passing conductive holes 17, called conductive vias, are realized inside the insulating core 12 to supply the electric connections between conductive tracks 13 formed on different surfaces of the substrate 11 and, for example, have a diameter comprised between 100-200 µm.

The conventional LGA substrates 11 are provided, on the upper surface 14 and lower surface 15 of the substrate 11, with electric contact lands 18, or conductive "lands", which are not coated by the masking layer 16. These conductive lands 18 are electrically connected to the conductive tracks 13 and can be organized in a grid configuration.

The substrate 11 is also provided with a passing opening 19, having a width A for example comprised between 300 and 500 µm.

The package 10 for MEMS devices according to embodiments of the invention also includes a MEMS device 20 including a die, for example of silicon, having a non active surface 21 and an active surface 22 opposed to the non active surface 21. Advantageously, in the silicon die, in correspondence with the active surface 22, a sensitive portion 23 of MEMS device 20 is integrated. In particular, the MEMS device 20 is a sensor wherein the portion 23 is sensitive to chemical and/or physical variations of a fluid present outside the package 10.

Advantageously, the MEMS device 20 is a pressure, flow, gas, pH, or in general a chemical sensor.

According to embodiments of the invention, the active surface 22 of the MEMS device 20 faces the upper surface 14 of the substrate 11 and is spaced therefrom and, moreover, the sensitive portion 23 is aligned to the passing opening 19.

Therefore the sensitive portion 23 of the MEMS device 20 interacts with the fluid through the passing opening 19.

Moreover, the peripheral portion of the active surface 22 of the MEMS device 20 is provided with connection pads 24 for the electric connection to the conductive lands 18 present on the upper surface 14, by means of electric connections 25, for example solder bumps.

Advantageously, the bumps 25 are of material comprising welding alloys, or conductive polymeric material or they are electrolytically grown. The bumps 25 can be formed both on the pads 24 of the MEMS device 20 and on the conductive lands 18 present on the upper surface 14 of the substrate 11.

Advantageously, before realizing the bumps 25 on the MEMS device 20, a UBM layer (Under Bump Metallization) is realized on the pads 24 of the MEMS device 20.

Advantageously, before realizing the bumps 25 on the substrate 11, a UBM layer (Under Bump Metallization) is realized on the conductive lands 18.

According to embodiments of the invention, the MEMS device 20 is electrically mounted on the substrate 11 through the known "flip-chip" assembling method.

Still according to embodiments of the invention, the package 10 includes a protective package 26, realized through molding, which incorporate the MEMS device 20 and the substrate 11, leaving the sensitive portion 23 of the MEMS device 20 exposed by means of the passing opening 19 of the substrate 11.

Advantageously, also the lower surface 15 of the substrate 11 is left exposed.

In other words, the MEMS device 20 is enclosed within the protective package 26.

Advantageously, an underfiller 27 is present in an area 28 which surrounds the sensitive portion 23 of the MEMS device 20 so as to incorporate the electric connections 25 and mechanically strengthen the package 10 in the connection area between the MEMS device 20 and the substrate 11.

Advantageously, the underfiller 27 is of an epoxy resin charged with particles of inert material.

Advantageously, the underfiller 27 shows a tapered profile, i.e., its cross section increases when approaching the upper surface 14 of the substrate 11.

The underfiller 27 may also cover at least partially the edge 20a of the MEMS device 20.

Advantageously, the underfiller 27 completely insulates the sensitive portion 23 of the protective package 26, and in particular protects the sensitive portion 23 during the manufacturing step, through molding, of the protective package 26 avoiding that the molding resin fills the hole of the substrate or contaminates the sensitive portion 23.

In a known way in fact, the formation of the protective package 26 provides the introduction, inside a cavity of a mold, of the substrate 11 whereon the MEMS device 20 is mounted and wherein the underfiller 27 has been dispensed, for example through capillarity between the active surface 22 of the MEMS device 20 and the upper surface 14 of the substrate 11.

In the mold cavity the injection at a high temperature of an electrically insulating material at the melted state is then provided, which will be the plastic body of the protective package 26. This material is typically a synthetic resin, for example epoxy resin.

The proper molding step involves the injection of the resin in the cavity of the mold. This step is then followed by a cooling step for completing the protective package 26.

As said for avoiding that the resin damages the sensitive portion 23 of the MEMS device 20 during the injection step, according to embodiments of the invention, between the upper surface 14 of the substrate 11 and the active surface 22, the underfiller 27 is provided which completely surrounds at least the sensitive portion 23 of the MEMS device 20.

A package according to a second embodiment of the invention is shown with reference to FIG. 4.

Elements being structurally and functionally identical with respect to the package described with reference to FIG. 3 will be given the same reference numbers.

In particular the package 10a comprises a substrate 11 provided with a passing opening 19 and a MEMS device 20 comprising an active surface 22 wherein a sensitive portion 23 of the MEMS device 20 is integrated.

According to this embodiment of the invention the active surface 22 of the MEMS device 20 faces the substrate 11 and is spaced therefrom, the sensitive portion 23 being aligned to the passing opening 19.

In this second embodiment, the surface 14 of the substrate 11 is completely devoid of the masking layer 16 and therefore the conductive vias 17 project with respect to the insulating core 12, for example, of about 30-35 µm.

Moreover, the peripheral portion of the active surface 22 of the MEMS device 20 is provided with connection pads 24 for the electric connection to the conductive vias 17 through interposition of a layer of connection material 29, such as, for example, the ACP (Anisotropic Conductive Paste), the NCP (Not Conductive Paste), the ACF (Anisotropic Conductive Tape), the NCF (Not Conductive Tape).

The package 10a also comprises a protective package 26a, which incorporates the MEMS device 20 and the substrate 20, leaving at least the sensitive portion 23 of the MEMS device 20 exposed, and the passing opening 19 of the substrate 11.

Advantageously, also the lower surface 15 of the substrate 11 is left exposed.

Advantageously, the layer of connection material 29 completely surrounds at least the sensitive portion 23 of the MEMS device 20.

Advantageously, the layer of connection material 29 completely insulates the sensitive portion 23 from the protective package 26, and in particular protects the sensitive portion 23 during the manufacturing step of the protective package 26, through molding, so that this sensitive portion 23 remains free.

Advantageously, the layer of connection material 29 shows a tapered profile, i.e., its cross section increases when approaching the upper surface 14 of the substrate 11.

Advantageously, according to this second embodiment to realize the electric connection between the MEMS device 20 and the substrate 11, it is not necessary to carry out any connection through wire bonding or pre-depositing the spheres of welding alloys (bumps) on the device. Moreover, no UBM are necessary on the conductive vias 17 and it is possible to close the package 10a with a protective package according to standard molding processes.

A package according to a third embodiment of the invention is shown with reference to FIG. 5.

Elements being structurally and functionally identical with respect to the package described with reference to FIGS. 3 and 4 will be given the same reference numbers.

In particular, the package 10b comprises a substrate 11 provided with a passing opening 19 and includes an insulating core 12 coated by metallic layers 13 wherein conductive tracks 13 are realized.

The conductive tracks 13 present on an upper surface 14 and a lower surface 15 of the substrate 11 are then coated by a masking layer 16.

Conductive lands 18, which are not coated by the masking layer 16 and are electrically connected to conductive tracks 13, are provided on the upper surface 14 and lower surface 15 of the substrate 11.

The package 10b also includes a MEMS device 20 including a die, for example of silicon, having a non active surface 21 and an active surface 22 opposed to the non active surface 21. Advantageously, in the silicon die, in correspondence with the active surface 22, a sensitive portion 23 of MEMS device 20 is integrated. In particular, the MEMS device 20 is a sensor wherein the portion 23 is sensitive to chemical and/or physical variations of a fluid present outside the package 10.

According to this embodiment of the invention, the active surface 22 of the MEMS device 20 faces the upper surface 14 of the substrate 11 and is spaced therefrom and the sensitive portion 23 is aligned to the passing opening 19.

Therefore, the sensitive portion 23 of the MEMS device 20 interacts with the fluid through the passing opening 19.

Moreover, the peripheral portion of the active surface 22 of the MEMS device 20 is provided with connection pads 24 for the electric connection to the conductive lands 18 of the upper surface 14, through interposition of a layer of connection material 29, such as, for example, the ACP (Anisotropic Conductive Paste), the NCP (Not Conductive Paste) or the ACF (Anisotropic Conductive Tape) and the NCF (Not Conductive Tape).

The package 10b also comprises a protective package 26b, which incorporates the MEMS device 20 and the substrate 11, leaving at least the sensitive portion 23 of the MEMS 20 device exposed, and the passing opening 19 of the substrate 11.

Advantageously, also the lower surface 15 of the substrate 11 is left exposed.

Advantageously, the layer of connection material 29 completely insulates the sensitive portion 23 from the protective package 26, and in particular protects the sensitive portion 23 during the manufacturing step of the protective package 26, through molding, so that this sensitive portion 23 remains free.

Advantageously, the layer of connection material 29 shows a tapered profile, i.e., its cross section increases when approaching the upper surface 14 of the substrate 11.

With reference to FIG. 6, the package 10 of FIG. 3 is shown wherein an integrated circuit 30 is mounted on the substrate 11 flanked to the MEMS device 20, and is fixed onto the substrate 11, for example by means of a welding layer.

The integrated circuit 30 is electrically connected to further conductive lands 18 present at the substrate 11 by means of further electric connections 31.

The protective package 26, realized through molding, incorporates the MEMS device 20, the underfiller 27, the integrated circuit 30 with the further electric connections 31 and the substrate 11, leaving the sensitive portion 23 of the MEMS device 20 exposed, and the passing opening 19 of the substrate 11.

Advantageously, also the lower surface 15 of the substrate 11 is left exposed.

With reference to FIG. 7, the package 10 of FIG. 3 is shown wherein an integrated circuit 30 is mounted on the non active surface 21 of the MEMS device 20.

The integrated circuit 30 is electrically connected to further conductive lands 18 present at the substrate 11 by means of further electric connections 31.

The protective package 26, realized through molding, incorporates the MEMS device 20, the underfiller 27, the integrated circuit 30 with the further electric connections 31 and the substrate 11, leaving the sensitive portion 23 of the MEMS device 20 exposed, and the passing opening 19 of the substrate 11.

Advantageously, also the lower surface 15 of the substrate 11 is left exposed.

With reference to FIG. 8, the package 10 of FIG. 3 is shown wherein an integrated circuit 30 is mounted on the substrate 1 flanked to the MEMS device 20, and fixed to the substrate 11. In particular, the integrated circuit 30 is provided with contact bumps 32 for the electric connection with further conductive lands 18 present on the upper surface 14, by means of electric connections 33, for example, bumps.

An underfiller 34 incorporates the electric connections 33. In other words the integrated circuit 30 is electrically connected to the substrate just as the MEMS device 20 is connected. Advantageously, the formation of the electric connection 25, 33 and of the underfiller 27, 34 is carried out simultaneously and with the same materials.

The protective package 26, realized through molding, incorporates the MEMS device 20, the underfiller 27, the integrated circuit 30 with the electric connections 31 and the substrate 11, leaving the sensitive portion 23 of the MEMS device 20 exposed, and the passing opening 19 of the substrate 11.

Advantageously, also the lower surface 15 of the substrate 11 is left exposed.

With reference to FIG. 9, the package 10a of FIG. 4 is shown wherein an integrated circuit 30 is mounted on the substrate 1 flanked to the MEMS device 20, and fixed to the substrate 11, for example, by means of a welding layer 12a.

The integrated circuit 30 is electrically connected to further conductive lands 18 present at the substrate 11 by means of further electric connections 31.

The protective package 26a, realized through molding, incorporates the MEMS device 20, the layer of connection material 29, the integrated circuit 30 with the further electric connections 31 and the substrate 11, leaving the sensitive portion 23 of the MEMS device 20 exposed, and the passing opening 19 of the substrate 11.

Advantageously, also the lower surface 15 of the substrate 11 is left exposed.

With reference to FIG. 10, the package 10a of FIG. 4 is shown wherein an integrated circuit 30 is mounted on the non active surface 21 of the MEMS device 20.

The integrated circuit 30 is electrically connected to further conductive lands 18 present at the substrate 11 by means of further electric connections 31.

The protective package 26a, realized through molding, incorporates the MEMS device 20, the layer of connection material 29, the integrated circuit 30 with the further electric connections 31 and the substrate 11, leaving the sensitive portion 23 of the MEMS device 20 exposed, and the passing opening 19 of the substrate 11.

Advantageously, also the lower surface 15 of the substrate 11 is left exposed.

With reference to FIG. 11, the package 10a of FIG. 4 is shown wherein an integrated circuit 30a is mounted onto the substrate 11 flanked to the MEMS device 20.

In particular, the integrated circuit 30a comprises a first active surface 30b and a second active surface 30c.

According to this embodiment of the invention the active surface 30b of the integrated circuit 30a faces the substrate 11 and is spaced therefrom.

In this embodiment, the surface 14 of the substrate 11 is completely devoid of the masking layer 16 and therefore the conductive vias 17 project with respect to the insulating core 12, for example, of about 30-35 µm.

Advantageously, the peripheral portion of the first active surface 30b is provided with connection pads 24a for the electrical connection of the conductive vias 17 through interposition of a layer of connection material 29, such as, for example, the ACP (Anisotropic Conductive Paste), the NCP (Not Conductive Paste), the ACF (Anisotropic Conductive Tape) or NCT (Not Conductive Tape).

The package 10a also comprises a protective package 26a, which incorporates the MEMS device 20, the substrate 11 and the integrated circuit 30a, leaving at least the sensitive portion 23 of the MEMS device 20 exposed, and the passing opening 19 of the substrate 11.

Advantageously, also the lower surface 15 of the substrate 11 is left exposed.

Advantageously, the layer of connection material 29 shows a tapered profile, i.e., its cross section increases when approaching the upper surface 14 of the substrate 11.

The package 10a according to this embodiment of the invention, for realizing the electric connection between the MEMS device 20 and the integrated circuit 30a and the substrate 11, it is not necessary to carry out connections through wire bonding or bumping, no UBM on the conductive vias 17 is necessary and it is possible to close the package 10a with the resin according to the standard molding processes, realizing a manufacturing process and thus a device at low cost.

The integrated circuit 30a may be realized on a conventional substrate LGA/BGA devoid of passing openings, wherein from the upper surface 14 of the substrate 11 facing the first active surface 30b of the integrated circuit 30a, and at least in correspondence with said active surface 30a, the masking layer has been completely removed therefore the vias project with respect to the core of the substrate, for example of about 30-35 µm.

In other words, advantageously, the portion CI which comprises the integrated circuit 30a can be realized stand alone.

On the same substrate whereon the integrated circuit 30a is realized, there may be a masking layer which covers conductive tracks provided on the LGA/BGA substrates, or the masking layer is removed form the whole substrate, making the manufacturing process of this package particularly economic.

With reference to FIGS. 12 to 15, a first method is now described for preventing that, in a package 10 for MEMS devices such as, for example, the one shown in FIG. 3, an underfiller 27, or the resin during the molding step of the protective package 26, if the underfiller 27 has not been realized, can contaminate a sensitive portion 23 of the MEMS device 20.

Elements being structurally and functionally identical with respect to the package described with reference to FIG. 3 will be given the same reference numbers.

In this first method according to an embodiment of the invention, a protection layer 35 is formed at least on the sensitive portion 23 of the MEMS device 20 before it is connected to a substrate 11.

Advantageously, the protection layer 35 is a paste washable in water.

Advantageously, this protection layer 35 is a viscous paste, with a viscosity comprised between 15.000 and 17.000 cps (Centipoises).

For example, the protection layer 35 is formed on the MEMS devices 20 after they have been singulated from the semiconductor wafer wherein they have been realized, as shown in FIG. 12. In a known way, these MEMS devices 20 are kept in position after the singulation from an adhesive layer 36, for example, an adhesive film.

Advantageously, the protection layer 35 is formed at least on a sensitive portion 23 of a MEMS device 20 by stencil printing.

In particular, a serigraphic mask 37 is formed on the MEMS devices 20. This serigraphic mask 37 is provided with openings 38 centrally aligned to the sensitive portions 23 of the MEMS devices 20. Advantageously, the width A1 of the openings 38 is greater than the width B of the sensitive portions 23.

For example, the width A1 of the openings 38 is equal to 0.7 µm, while the width B of the sensitive portions 23 is equal to 0.5 µm.

The protective layer is dispensed on the serigraphic mask 37, thus with a spatula 39 it is distributed inside the openings 38.

The arrow F indicates the direction and the orientation according to which the spatula 39 is moved.

Advantageously, electric connections 25, for example bumps, are formed on the MEMS devices 20, prior to the formation of the protection layer 35. In this case in the serigraphic mask 37 sockets 40 have been made to house electric connections 25.

Once the serigraphic mask 27 has been removed, the MEMS devices 20 are covered by a cylinder of protection layer 35 with size of approximately 0.2×0.6 mm which is dried in air at environment temperature.

The MEMS devices 20 thus protected are assembled on the substrate 11. In particular, the cylinder of protection layer 35 engages with the passing opening 19 of the substrate 11, as shown in FIG. 13.

According to this embodiment of the invention, the protection layer 35 shields the sensitive portion 23 of the MEMS device 20 during the formation step, for example through dispensation of an underfiller 27, as shown in FIG. 14, or during the molding step of the protective package 26, as shown in FIG. 15.

With reference to FIGS. 16 to 18, a second method is now described for preventing that, in a package 10 for MEMS devices such as, for example, the one shown in FIG. 3, an underfiller 27 can contaminate a sensitive portion 23 of the MEMS device 20.

Elements being structurally and functionally identical with respect to the package described with reference to FIG. 3 will be given the same reference numbers.

In this second method according to an embodiment of the invention, a protection layer 35 is formed at least on the sensitive portion 23 of the MEMS device 20 after it has been connected to a substrate 11 provided with a passing opening 19 which is aligned to the sensitive portion 23.

Advantageously, the protection layer 35 is a paste washable in water.

Advantageously, this protection layer 35 is a viscous paste, with a viscosity comprised between 15.000 and 17.000 cps (Centipoises).

In particular, the protection layer 35 fills the passing opening 19.

Advantageously, the protection layer 35 is formed at least on a sensitive portion 23 of a MEMS device 20 by stencil printing, the protection layer 35 being formed on a lower surface 15 of the substrate 11, then, with a spatula 39, being distributed inside the passing opening 19.

The arrow F indicates the direction and the orientation with which the spatula 39 moves during the filling step of the passing opening 19.

During this step, carried out, for example, by stencil printing, the protection layer 35 tends to widen in the space comprised between the MEMS device 20 and the substrate 11.

Advantageously, the width C of the passing opening 19 is calculated as a function of the widening.

Advantageously, the width C of the passing opening 19 is equal to about 0.5 mm and the width D of the protection layer 35 in contact with the MEMS device 20 is of about 1 mm, while the distance S between the MEMS device 20 and the substrate 11 is of about 0.2 mm.

Advantageously, a barrier element 11a is formed on the substrate 11 and surrounds the passing opening 19. In particular, this barrier element 11a does not contact the MEMS device 20.

According to this embodiment of the invention the protection layer 35 shields the sensitive portion 23 of the MEMS device 20 during the formation step, for example, through dispensation, of an underfiller 27, as shown in FIG. 17, or during the molding step of the protective package 26, as shown in FIG. 18.

With reference to FIGS. 19 to 21, the first method is now described for preventing that, in a package 10a, 10b for MEMS devices such as, for example, the one shown in FIGS. 4 to 5, a layer of connection material 29 can contaminate a sensitive portion 23 of the MEMS device 20.

Elements being structurally and functionally identical with respect to the package described with reference to FIGS. 4 and 5 will be given the same reference numbers.

As shown in these figures, the protection layer 35 is formed before realizing the layer of connection material 29.

The two illustrated methods according to embodiments of the invention are then completed by removing the protection layer 35.

Advantageously, according to the invention if the protection layer 35 is a paste washable in water, this layer 35 is removed through washing before in cold water and then in hot water.

Preferably, the washing is carried out with spray jets of cold water at a pressure of 4 atmospheres and then with spray jets of hot water at 50° C. at a pressure of 4 atmospheres.

Advantageously, the protection layer 35 is a paste washable in water through washing in cold water with ultrasounds.

Advantageously, according to these embodiments of the invention the use of a protection layer 35 for protecting the sensitive portion 23 of the MEMS device 20 allows reducing the geometries of the package, thereby allowing the encapsulation of very small devices.

It is also possible to reduce the diameter of the passing opening 19, since this takes care of the single function of connecting the outer environment with the MEMS device 20. In this way the stresses on the substrate 11 due to the presence of the passing opening 19 are reduced.

The protection layer 35 can be also used as protection from the contamination during the delivery of the packages 10 and successive assembling steps on PCB and removed only afterwards.

In conclusion, the package 10, 10a and 10b according to embodiments of the invention allows one to put in communication the MEMS device 20 with the environment outside the package 10, 10a and 10b through the passing opening 19 of the substrate 11 and the MEMS device 20 being then encapsulated in a full molded package 26, 26a and 26b.

Advantageously, in the package 10, 10a according to embodiments of the invention the MEMS device 20 is fixed onto the substrate 11 after having formed bumps on the MEMS device 20 or on the substrate 11.

Advantageously, in the package 10, 10a and 10b according to embodiments of the invention the technique of wire bonding connection and possibly of bumping is not used for realizing the electric connections onto the substrate 11.

Packages including MEMS devices as described in the above embodiments of the present invention, in which the MEMS device is a pressure, flow, gas, pH, or other type of sensor, can be contained in a variety of different types of electronic systems, such as control systems, test equipment, safety systems, and so on.

From the foregoing it will be appreciated that, although specific embodiments of the invention have been described herein for purposes of illustration, various modifications may be made without deviating from the spirit and scope of the invention.

The invention claimed is:

1. A method for protecting packages comprising a substrate provided with a passing opening, and at least one MEMS device comprising an active surface wherein a portion of said MEMS device is integrated sensitive to chemical/physical variations of a fluid, the method comprising the following steps:

forming on said sensitive portion a protection layer which fills at least partially said passing opening, forming a protective package, which incorporates said MEMS device and said substrate, leaving said protection layer exposed, removing said protection layer so that said protective package leaves at least said sensitive portion of said MEMS device exposed, through said passing opening of said substrate.

2. The method according to claim 1, wherein said protection layer is formed of a paste washable in water.

3. The method according to claim 1, wherein said protection layer is a viscous paste, with a viscosity comprised between 15.000 and 17.000 cps.

4. The method according to claim 1, wherein said protection layer is formed at least on said sensitive portion of the MEMS device before it is connected to said substrate.

5. The method according to claim 1, wherein said protection layer is formed at least on said sensitive portion of said MEMS device by stencil printing.

6. The method according to claim 1, wherein said protection layer is formed at least on said sensitive portion of the MEMS device after it has been connected to a substrate.

7. The method according to claim 5, wherein said protection layer is formed on a lower surface of the substrate, then with a spatula it is distributed inside said passing opening.

8. The method according to claim 2, wherein said protection layer is removed through a washing step first in cold water and then in hot water.

9. The method according to claim 8, wherein said washing step is carried out with spray jets of cold water at a pressure of about 4 atmospheres and then with spray jets of hot water at about 50° C. at a pressure of about 4 atmospheres.

10. The method according to claim 2, wherein said protection layer is removed through a washing step in cold water with the help of ultrasounds.

11. A method of protecting packages including a substrate and a die, the die including an active surface including a sensitive portion and the method comprising:

forming a passing opening in the substrate;

forming a protection layer over the sensitive portion of the die;

attaching the die to the substrate;

forming a protective package to house the substrate and the die, the protective package leaving the passing opening exposed; and removing the protection layer through the passing opening.

12. The method of claim 11, wherein the protection layer forms a projection extending from the active surface of the die;

wherein attaching the die to the substrate includes inserting the projection into the passing opening.

13. The method of claim 11 wherein attaching the die to the substrate is done before forming the protection layer.

14. The method of claim 11 wherein the protection layer comprises a water soluble paste.

* * * * *